(12) United States Patent
Akimoto (10) Patent No.: US 7,744,714 B2
(45) Date of Patent: Jun. 29, 2010

(54) PASTE PATTERNS FORMATION METHOD AND TRANSFER FILM USED THEREIN

(75) Inventor: Hideki Akimoto, Tochigi-Ken (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 681 days.

(21) Appl. No.: 11/602,080

(22) Filed: Nov. 20, 2006

(65) Prior Publication Data

US 2008/0116615 A1    May 22, 2008

(51) Int. Cl.
*B44C 1/175* (2006.01)
*B44C 1/22* (2006.01)
*B29C 65/54* (2006.01)
*B32B 37/02* (2006.01)
*B32B 37/06* (2006.01)
*B32B 37/12* (2006.01)
*B29C 65/56* (2006.01)
*B32B 37/04* (2006.01)
*B32B 38/04* (2006.01)
*B32B 38/18* (2006.01)

(52) U.S. Cl. ............. 156/236; 156/230; 156/247; 156/249; 156/272.8; 428/1.1; 428/1.2; 428/1.5; 428/1.53

(58) Field of Classification Search ............ 156/236, 156/272.8, 230, 247, 249; 428/1.1, 1.2, 1.5, 428/1.53
See application file for complete search history.

(56) References Cited

U.S. PATENT DOCUMENTS

| | | | | |
|---|---|---|---|---|
| 3,985,953 A | * | 10/1976 | Dunkley | 358/3.29 |
| 5,296,442 A | * | 3/1994 | Fujimura et al. | 503/227 |
| 6,290,798 B1 | * | 9/2001 | Onishi et al. | 156/230 |
| 6,740,354 B2 | * | 5/2004 | Chung | 427/148 |

| | | | |
|---|---|---|---|
| 2001/0008825 A1 | | 7/2001 | Toyoda et al. |
| 2002/0163108 A1 | | 11/2002 | Oshio et al. |

FOREIGN PATENT DOCUMENTS

| | | | |
|---|---|---|---|
| EP | 0836892 A1 | * | 4/1996 |
| EP | 0 836 892 A | | 4/1998 |
| EP | 0836892 A2 | * | 4/1998 |
| EP | 1024514 A1 | * | 8/2000 |
| JP | 1993 067864 A | | 3/1993 |
| JP | 1993 326989 A | | 12/1993 |
| JP | 1994 139922 A | | 5/1994 |
| JP | 1995 122839 A | | 5/1995 |
| JP | 1995 192626 A | | 7/1995 |
| JP | 1996 097448 A | | 4/1996 |
| JP | 10 134705 A | | 5/1998 |

(Continued)

OTHER PUBLICATIONS

International Search Report Dated May 21, 2008 for International Patent Application PCT/US2007/024191.

*Primary Examiner*—Philip C Tucker
*Assistant Examiner*—Sonya Mazumdar (57) ABSTRACT

Disclosed is a paste pattern formation method comprising the steps of: forming a transfer pattern material on a film base material to prepare a transfer film; sticking the transfer film on a substrate on which a transfer pattern is formed so that the transfer pattern material contacts the substrate; separating the film base material from the transfer pattern material; filling a paste into the transfer pattern depression; solidifying the paste; and removing the transfer pattern material.

17 Claims, 8 Drawing Sheets

FOREIGN PATENT DOCUMENTS

| | | |
|---|---|---|
| JP | 1998 268527 A | 10/1998 |
| JP | 1998 282683 A | 10/1998 |
| JP | 1998 289656 A | 10/1998 |
| JP | 1998 326560 A | 12/1998 |
| JP | 1999 144619 A | 5/1999 |
| JP | 2000057941 A * | 2/2000 |
| JP | 2000 231201 A | 8/2000 |
| JP | 2000 294121 A | 10/2000 |
| JP | 2002 290017 A | 10/2002 |
| JP | 2003 107698 A | 4/2003 |
| JP | 2003 123639 A | 4/2003 |
| JP | 2004 281738 A | 10/2004 |
| JP | 2005 166914 A | 6/2005 |
| WO | 99/21208 A | 4/1999 |

* cited by examiner

FIG. 3D
Continued from Fig. 3C

FIG. 3G
Continued from Fig. 3F

PASTE PATTERNS FORMATION METHOD AND TRANSFER FILM USED THEREIN

BACKGROUND OF THE INVENTION

1. Field of the Invention

The present invention relates to a paste pattern formation method. More particularly, the present invention relates to a paste pattern formation method for forming a paste pattern having a high aspect ratio. The present invention also relates to a transfer film used in this paste pattern formation method.

2. Description of the Related Art

Various types of patterns are formed in electrical devices. For example, predetermined electrode patterns are formed on the top and bottom surfaces in solar cells. In addition, predetermined wiring patterns are formed on a substrate in wiring boards. Moreover, patterns of barrier ribs for separating each dot, address wires, electrodes and so on are formed in plasma display panels (PDP).

The ability to easily produce patterns having a high aspect ratio is an important issue common to these applications.

With respect to the electrode patterns of solar cells, it is preferable to reduce the surface area occupied by the electrode pattern on the light-receiving surface in order to increase the light receiving surface area of the solar cell. However, reduction in the cross-sectional area of the electrode pattern causes a decrease in electrical conductivity of the electrode pattern. Consequently, it is desirable to enhance the electrical conductivity of the electrode pattern by forming an electrode pattern that has adequate thickness in the perpendicular direction. In other words, an electrode pattern having a high aspect ratio is preferred.

In a wiring board, the use of a fine wiring pattern is desirable to achieve high density, and in this case as well, a wiring pattern having a high aspect ratio is desirable.

In PDP, if the barrier ribs are too wide, the dot pitch becomes large and it is not possible to achieve high resolution. Consequently, it is desirable to narrow the barrier ribs and in this case as well, barrier ribs having a high aspect ratio are desirable.

An example of a method for forming a desired pattern having a high aspect ratio in these applications consists of repeatedly carrying out screen printing. In the case of screen printing, however, since there are limits on the amount of paste that can be coated in a single coating, in order to form a pattern of adequate thickness; it is necessary to repeatedly print the paste many times. In addition, in the case of printing several times, it is difficult to position the coating paste with high precision each time.

Therefore, a technique is known in which patterning is carried out using a photosensitive paste as a means of forming a thick film pattern without using screen printing (see, for example, Japanese Patent Application Laid-open No. 2003-107698). However, processes using photosensitive paste require an expensive investment with respect to the mask, developing apparatus and so on, and production costs tend to be high. In addition, since the electrically conductive or insulating fine powder contained in the paste is optically opaque, random reflection occurs within the paste composition during exposure when the coating thickness is increased, thereby preventing light from adequately reaching deep portions of the paste. Consequently, it is difficult to obtain a pattern of high aspect ratio simply by using a photosensitive paste and developing directly. Moreover, since photosensitive paste has poor storage stability, control and transport of materials is bothersome.

In consideration of these circumstances, a technique is used in which a thick film pattern is formed which does not require a photosensitive paste (see, for example, Japanese Patent Application Laid-open No. 2002-290017). This document discloses a technology in which, after forming a pattern by injecting a metallized paste into a groove pattern, and transferring the metallized paste to a ceramic substrate. In the case of forming a pattern and then transferring it to a substrate in this manner, an adhesion means is required to suitably transfer the pattern to the substrate. Examples of such adhesion means include an adhesive layer or blending-in a pressure-sensitive adhesive component into the pattern. However, in the case of using an adhesive layer, not only is there the added step of forming the adhesive layer, there is also the risk of the adhesive layer components diffusing into the pattern, as well as a decrease in electrical conductivity or other predetermined pattern properties. In addition, in the case of blending a pressure-sensitive adhesive component into the pattern, it is difficult to select a preferable pressure-sensitive adhesive component so that the required properties of the pattern do not decrease due to the addition of the pressure-sensitive adhesive component. Moreover, as is described in this document, in the case of transferring to a substrate following pattern formation, there is the risk of the pattern itself being deformed or the desired aspect ratio being unable to be obtained due to pressure applied to the pattern during transfer.

SUMMARY OF THE INVENTION

An object of the present invention is to provide an inexpensive method for forming a paste pattern having a high aspect ratio that enables production to be carried out easily, and does not cause a decrease in paste pattern properties.

The present invention relates to paste pattern formation method comprising the steps of: applying a transfer pattern on a film base material, wherein said transfer pattern comprises a transfer pattern material and transfer pattern depressions, thus forming a transfer film; transferring the transfer film onto a substrate so that the transfer pattern material contacts the substrate; separating the film base material from the transfer pattern material; applying a paste into the transfer pattern depressions, resulting in a paste pattern; solidifying the paste; and removing the transfer pattern material.

The invention further concerns a paste pattern formation method comprising the steps of: applying a transfer pattern material on a film base material; forming a transfer pattern depression(s) in the transfer pattern material, thus forming a transfer film; transferring the transfer film onto a substrate so that the transfer pattern material contacts the substrate; separating the film base material from the transfer pattern material; applying a paste into the transfer pattern depression(s), resulting in a paste pattern; solidifying the paste; and removing the transfer pattern material.

Patterning the transfer pattern may be done by laser, photoetching, press stamping or other known methods.

In addition, the present invention includes a transfer film used in this paste pattern formation method in which a transfer pattern depression is formed on a film base material.

DETAILED DESCRIPTION

The paste pattern formation method of the present invention forms a paste pattern by preliminarily transferring only a transfer pattern material to a substrate and then filling a paste into the pattern depression. Consequently, a paste pattern having a desired aspect ratio can be obtained by suitably altering the height of the transfer pattern material and thus, the pattern depression. In the case of forming a paste pattern having a high aspect ratio in particular, a paste pattern having a high aspect ratio can be realized easily by overlapping several indentations.

In addition, since the paste pattern formation method of the present invention does not necessarily require large-scale production apparatus, (such as an exposure apparatus) during paste pattern formation, and does not require control and transport costs for photosensitive materials as in the case of using a photosensitive paste for the pattern material, paste patterns can be formed inexpensively.

Moreover, the paste pattern formation method of the present invention does not involve the transfer of a dry paste to a substrate after having preliminary formed a pattern by injecting a paste into a groove pattern, but rather realizes paste pattern formation by transferring only a transfer pattern material to a substrate followed by applying a paste directly into the transfer pattern depression and solidifying said paste. Consequently, paste pattern formation can be carried out easily without interposing an adhesive layer between the substrate and paste nor blending adhesive components into the paste. However, this method does not prevent the use of an adhesive layer or adhesive components. In the case that components of a layer other than the paste pattern layer, such as an adhesive layer, are not used, there is no diffusion of components from other layers into the paste pattern layer.

In addition, there is no pressure during the application of the paste other than the pressure required due to the application method, for example, squeegee pressure. Consequently, there is minimal risk of deformation of the paste pattern itself during production. Thus, the desired paste pattern properties can be reliably obtained.

As used herein, "paste pattern" refers to the pattern of the paste on the substrate. Both paste pattern before solidifying and after solidifying are included in the definition. As used herein, "transfer pattern" refers to the pattern on the film base material, which is transferred to the substrate. The transfer pattern comprises a "transfer pattern material", which refers to the material itself, and "transfer pattern depressions", which refers to the space in the pattern in which there is not material.

In the present invention, a pattern (or paste pattern) having a high aspect ratio refers to a pattern (or paste pattern) in which the ratio of the pattern surface area to the surface in which the pattern is formed, and particularly the width thereof, is comparatively small, and which has a comparatively large thickness in the direction perpendicular to the above-mentioned surface in which the pattern is formed.

Figure 1:
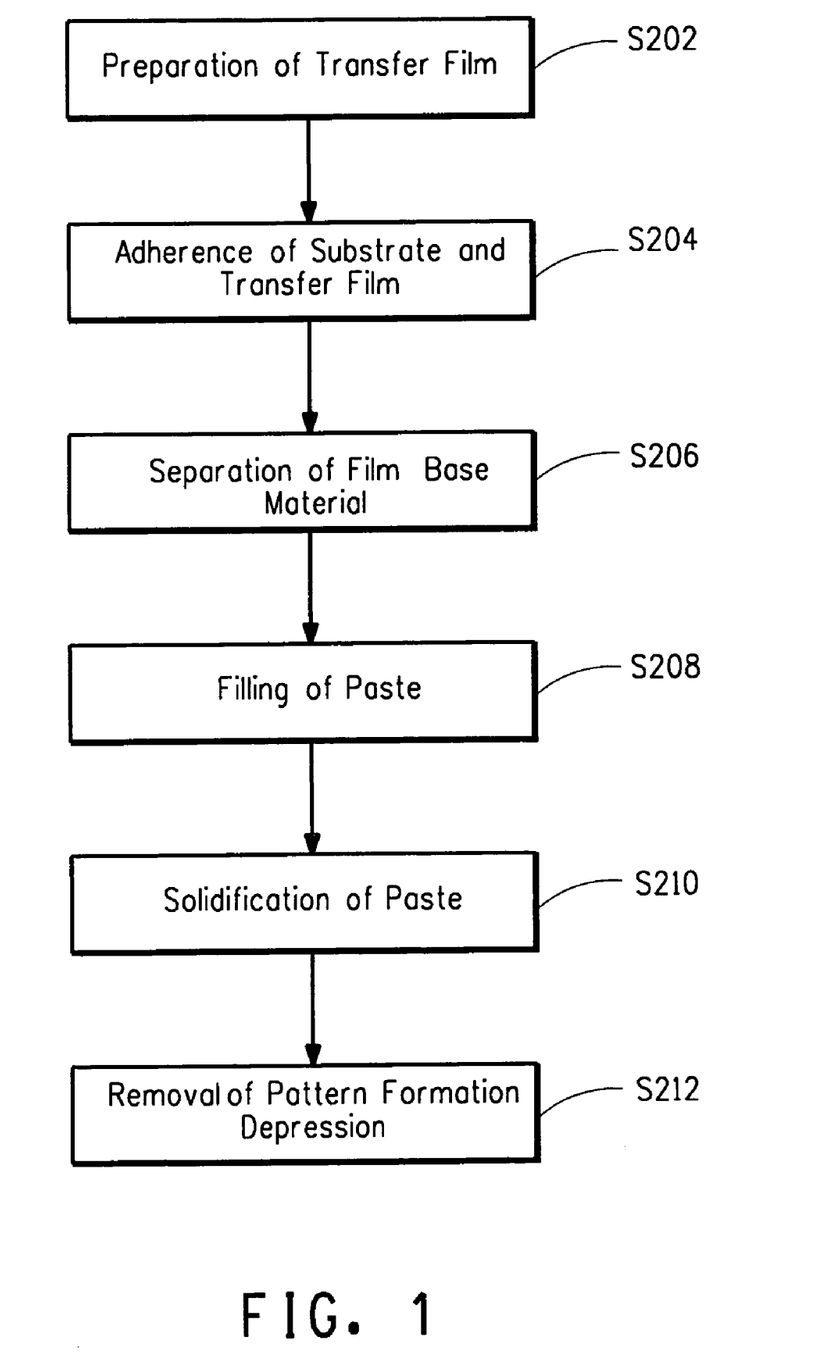
FIG. 1 is a flow chart of the entire paste pattern formation method of the present invention.
Figure 2A:
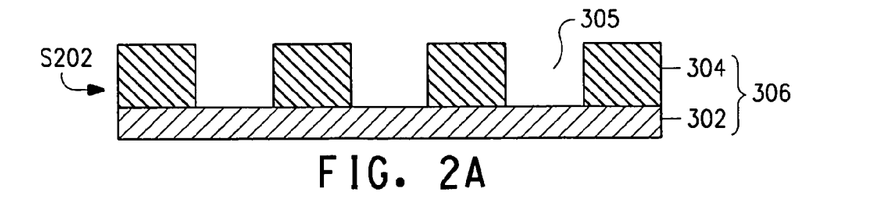
FIGS. 2A-2E are lateral cross-sectional views using constituent elements of each step shown in FIG. 1.
Figure 2B:
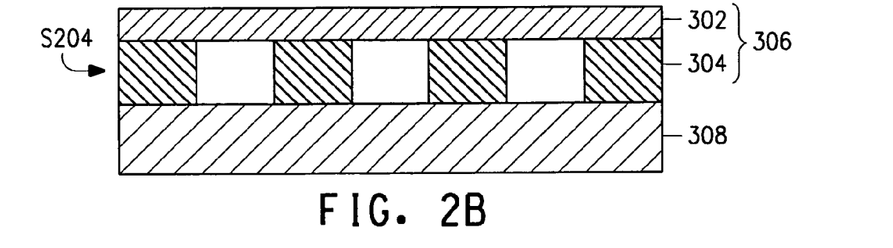
Figure 2C:
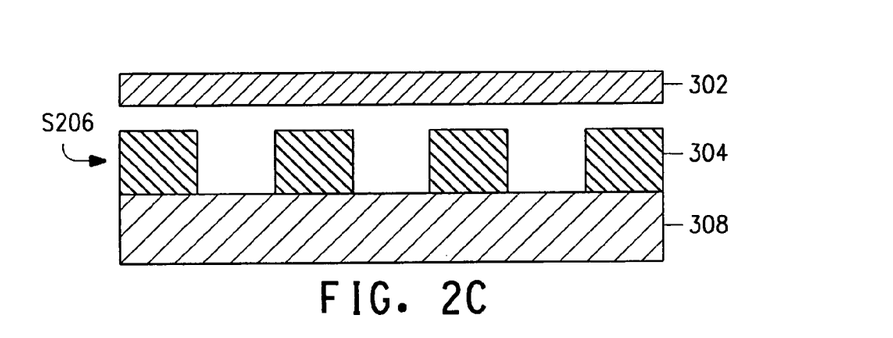
Figure 2D:
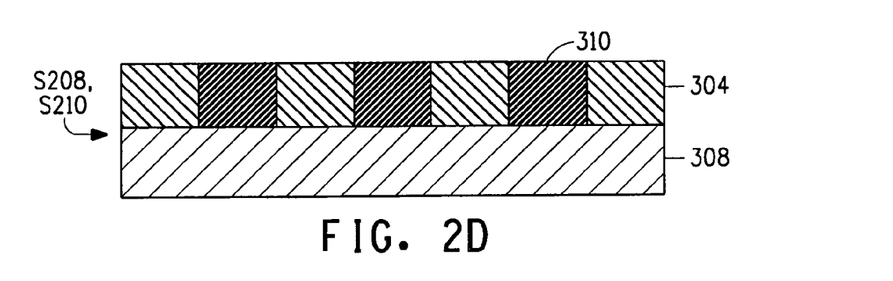
Figure 2E:
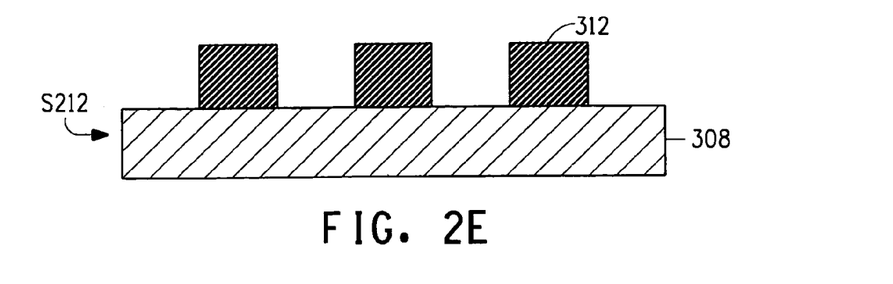

FIG. 1 is a flow chart of the entire paste pattern formation method of the present invention, while FIG. 2 is a lateral cross-sectional view using constituent elements of each step shown in FIG. 1.

As shown in FIGS. 1 and 2, the paste pattern formation method of the present invention comprises first to sixth steps (S202 to S212). In the first step (S202 in FIGS. 1 and 2A), a transfer pattern, comprising a transfer pattern material 304 and a transfer pattern depression 305 is formed on a film base material 302 to prepare a transfer film 306. In the second step (S204 in FIGS. 1 and 2B), transfer film 306 is transferred to a substrate 308 so that the pattern material 304 contacts substrate 308. In the third step (S206 in FIGS. 1 and 2C), film base material 302 is separated from transfer pattern material 304. In the fourth step (S208 in FIGS. 1 and 2D), a paste 310 is applied into the transfer pattern depression 305. In the fifth step (S210 in FIGS. 1 and 2D), paste 310 is solidified. In the sixth step (S212 in FIGS. 1 and 2E), the transfer pattern material (not shown) is removed from substrate 308 to obtain a desired pattern 312.

The paste pattern formation method of the present invention is suitable for forming a paste pattern having a high aspect ratio. For example, the paste pattern formation method of the present invention is suitable for forming a paste pattern having a high aspect ratio, as defined by "pattern thickness/pattern width" on a surface on which a paste pattern is formed, of 1/5 or more. There are no particular limitations on the upper limit of the aspect ratio, but 10/1 is a preferred upper limit in terms of productivity. In one embodiment, the aspect ratio may range from 1/5 to 10/1.

The following provides a detailed explanation of each of the above-mentioned first though sixth steps.

(First Step)

FIG. 3 is a detailed lateral cross-sectional view of the first step in FIG. 2. In this step, a film base material 402 is first prepared (FIG. 3A. A smooth film-like material which has separability with respect to the transfer pattern material, and which is stable at a drying temperature, can be used for film base material 402. Examples of film base materials may comprise metal, paper and polymer materials. Typical examples of polymer materials which can be used include polyethylene, polypropylene, polystyrene, polyvinyl chloride, polyvinylidene chloride, polyamide, polyethylene terephthalate, polybutylene terephthalate, polyacetal, polycarbonate, polyphenylene oxide, polyethylene naphthate, polyphenylene sulfide, polysulfone, polyether sulfone, polyether imide, polyether ether ketone, polyamide imide, crystalline polymer, polyimide resin and fluororesin. The film base material surface can be subjected to releasing treatment in the form of silicon treatment and so on, as necessary. Next, a transfer pattern material 404 is formed on film base material 402 (FIG. 3B). The type of transfer pattern material 404 differs according to the processing mode of transfer pattern material 404 to be described later. Transfer pattern material 404 can be formed by, for example, coating a paste-like resin or resin solution and drying. Examples of preferable methods for applying the transfer pattern material at a uniform thickness include coating with a blade coater, reverse coater, bar coater, gravure coater, knife coater, spray coater, die coater or comma coater followed by drying to obtain a predetermined thickness.

After having formed transfer pattern material 404 on film base material 402 in this manner, transfer pattern material 404 is processed to a predetermined shape to form a transfer pattern depression 405. There are no particular limitations on the method for forming the transfer pattern depression, and examples of methods that can be used include those that use a laser (FIGS. 3C to 3E) and those that use press stamping (FIGS. 3F to 3H).

In the case of adopting a method that uses a laser, transfer pattern material 404 is removed at the site irradiated with the laser 406. In the case the polymer itself used in transfer pattern material 404 lacks the ability to absorb the laser, transfer pattern material 404 can be processed with a laser by preliminarily dispersing a laser-absorbing pigment or dye in the paste. Carbon powder or graphite powder is preferable, since these powders exhibit superior laser absorption. Therefore, one embodiment of the transfer pattern material comprises material selected from carbon powder, graphite powder, and combinations thereof. There are no particular limitations on the materials that constitute the transfer pattern material provided it can be formed into the form of a film and can stick to a substrate 502 to be described later and ultimately be removed. Examples of these materials include polyethylene, polypropylene, polybutadiene, polyvinyl chloride, polystyrene, polyvinyl alcohol, polyvinyl acetate, ethylene-vinyl alcohol copolymer, polyvinyl pyrrolidone, ethyl cellulose, ABS plastic, acrylic resin, epoxy resin, urethane resin and photoresist resins. The material to be used may be suitably selected corresponding to the patterning method. For example, in the case of patterning using a laser, a resin that is easily decomposed by heat is used, examples of which include polyvinyl alcohol, ethyl cellulose and polybutadiene. In addition, if attempting to remove by dissolving with water, a water-soluble resin is preferable, examples of which include polyvinyl alcohol, polyvinyl pyrrolidone and carboxymethyl cellulose.

Figure 3A:
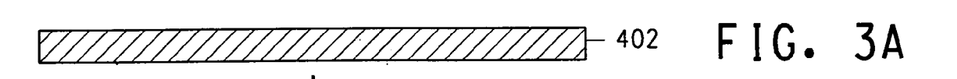
FIGS. 3A-3H are lateral cross-sectional views of steps in which a transfer pattern is formed on a film base material to prepare a transfer film.
Figure 3B:
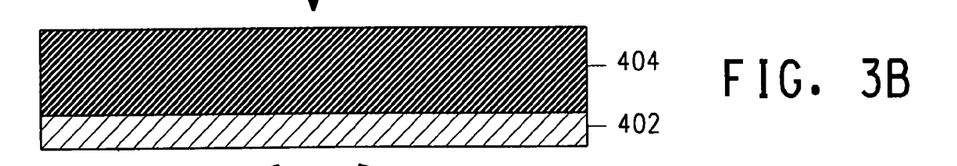
Figure 3C:
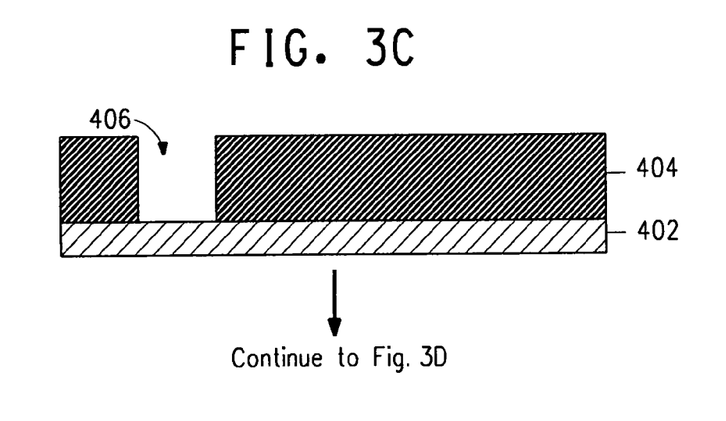
Figure 3D:
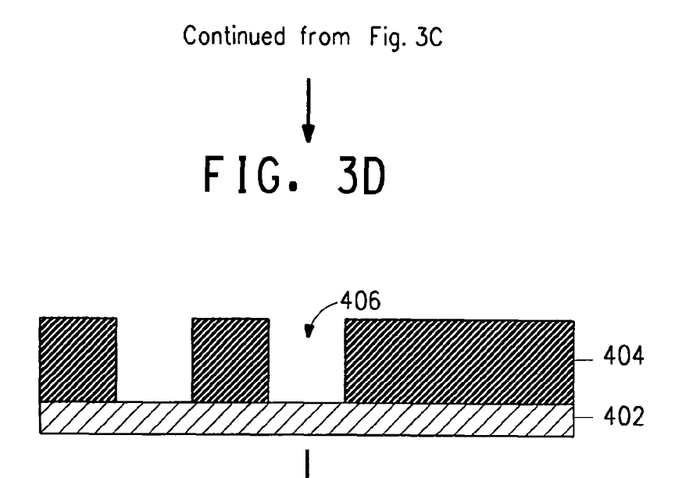
Figure 3E:
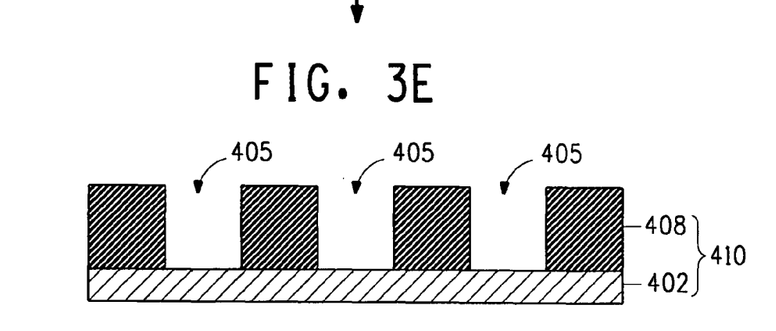
Figure 3F:
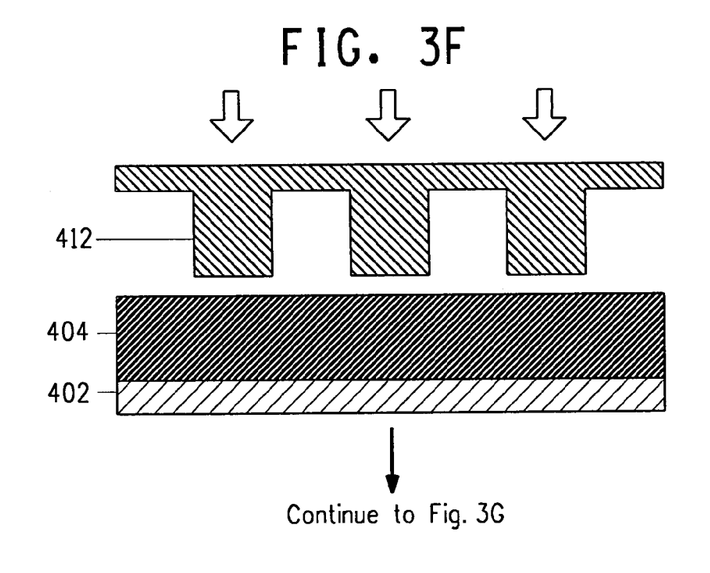
Figure 3G:
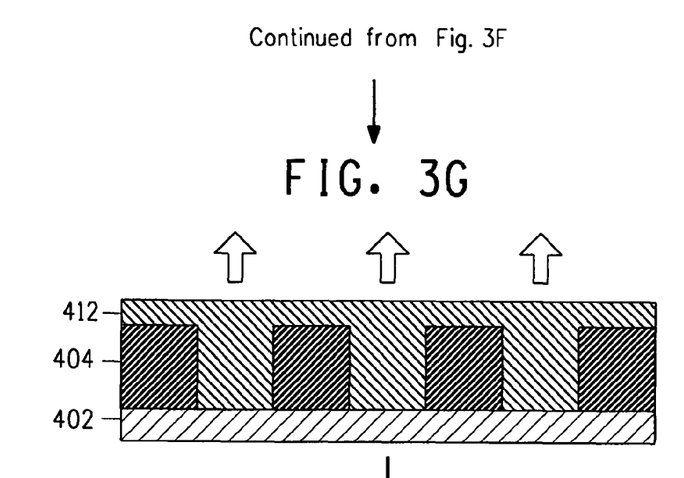
Figure 3H:
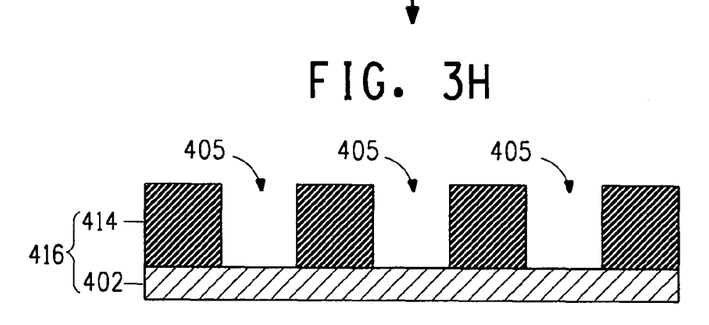

After having suitably selected the material of transfer pattern material 404 in this manner, transfer pattern material 404 is formed on film base material 402, and a predetermined transfer pattern 408 (made of transfer pattern material 404 and transfer pattern depression 405) is formed at a predetermined location of transfer pattern material 404 by sequentially irradiating with a laser 406 to obtain a transfer film 410 (FIGS. 3C to 3E). A laser that is absorbed by transfer pattern material 404 and penetrates film base material 402 is used for laser 406 used at this time. YAG lasers are preferable since they penetrate Teflon films and polyester films. Furthermore, the use of a laser normally results in the risk of the laser reaching film base material 402 causing damage thereto. In the present invention, however, since film base material 402 is separated in a subsequent step and is not directly involved in paste pattern formation, damage to film base material 402 does not present a problem even if it is damaged.

In the case of laser patterning, digital patterning eliminates the need for expensive molds such as a die or exposure mask in comparison with other patterning methods (such as press stamping or photoetching to be described later), while also enabling the pattern to be changed by simply modifying CAD data. Since laser patterning involves the drawing of lines, although this method tends to take considerable time if the pattern surface area is large, patterning time does not present that much of a problem in applications having small pattern surface areas. For example, since the electrode pattern of a solar cell has an extremely small surface area to secure a light receiving surface area with respect to the substrate surface area, the time required for patterning is short even if laser patterning is applied.

In contrast, in the case of adopting a technique using press stamping, a thermoplastic film or thermosetting or photosetting liquid resin is used for the composition of transfer pattern material 404, a die 412 heated to a high temperature is pressed on a predetermined location of the transfer pattern material 404 formed on the film base material 402, the die 412 is then removed and a desired pattern formation depression 414 is formed to obtain a transfer film 416 (FIGS. 3F to 3H). Glass, metal of silicon is used for die 412, and in the case of a thermoplastic film, the film is molded at a temperature equal to or higher than the softening point, while in the case of a thermosetting resin, the resin is cured with light or heat. A technique such as hot embossing can be used as an example of press stamping in the case transfer pattern material 404 is a thermoplastic resin.

Furthermore, patterning by press stamping offers the advantage of being able to produce a transfer pattern in less time than other patterning methods (such as laser processing and photoetching).

Moreover, although not shown in FIG. 3, patterning can also be carried out by photoetching on the condition of using a dry film resist for transfer pattern material 404 after having formed transfer pattern material 404 on film base material 402. Furthermore, although patterning by photoetching requires exposure and developing apparatuses, in the case the wiring pattern is fine and complex, it offers the advantage of being able to form the transfer pattern in less time than other patterning methods (such as laser processing and press stamping).

(Second Step)

Figure 4A:
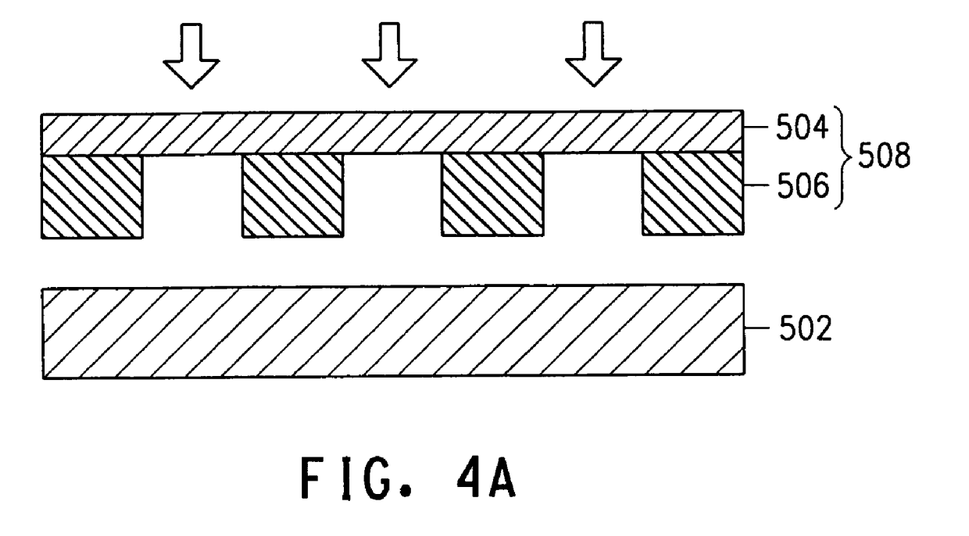
FIGS. 4A and 4B are lateral cross-sectional views of steps in which a transfer film is stuck on a substrate on which a paste pattern is formed, so that the transfer pattern material contacts the substrate on which the paste pattern is formed.
Figure 4B:
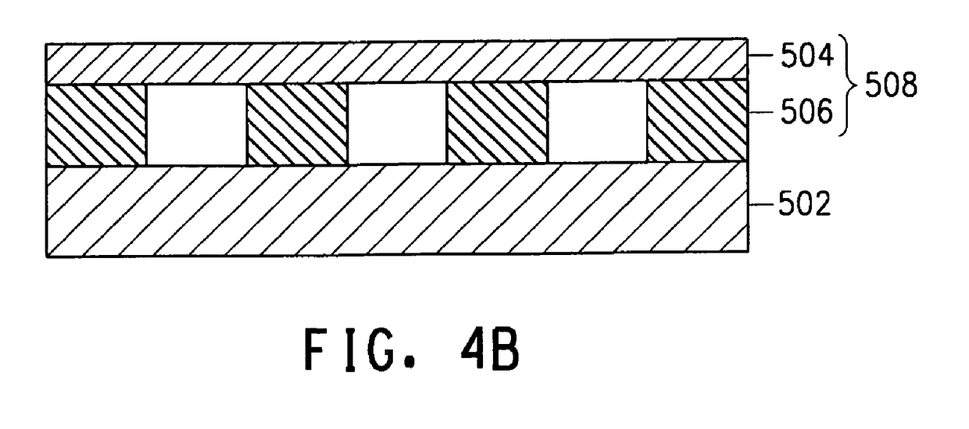

FIG. 4 is a detailed lateral cross-sectional view of the second step S204 in FIG. 2.

In this step, a transfer film 508 comprised of a film base material 504 and a transfer pattern material 506 is stuck on a substrate 502 (FIG. 4A). There are no particular limitations on the sticking means, and attachment may be carried out with a laminator or press. In the case of producing transfer pattern depression 506 with a thermoplastic resin, attachment of substrate 502 and transfer pattern depression 506 is carried out at a temperature equal to or higher than the softening point of the resin. In the case of producing transfer pattern material 506 with a thermosetting resin, the thermosetting resin is molded in the B stage (semi-cured state) and then adhered at a temperature equal to or higher than the softening point. Substrate 502 can also be adhered to the transfer pattern (a film comprising the transfer pattern material, transfer pattern depression(s), and film base material) 508 after having heated substrate 502 to the vicinity of the softening point of the transfer pattern material.

In addition, in the case the transfer pattern material has tackiness, this adhering can be carried out simply by applying pressure without heating. Moreover, this adhering can also be carried out by applying a silicon-based or acrylic-based removable pressure-sensitive adhesive to the adhered portion of transfer film 508.

Furthermore, substrate 502 and transfer film 508 are preferably pressed following attachment (FIG. 4B) to enhance adhesive strength therebetween. For example, substrate 502 and transfer film 508 can be pressed with a laminator or press.

Substrate 502 is cooled to room temperature in the case of having been stuck by applying heat.

(Third Step)

Figure 5A:
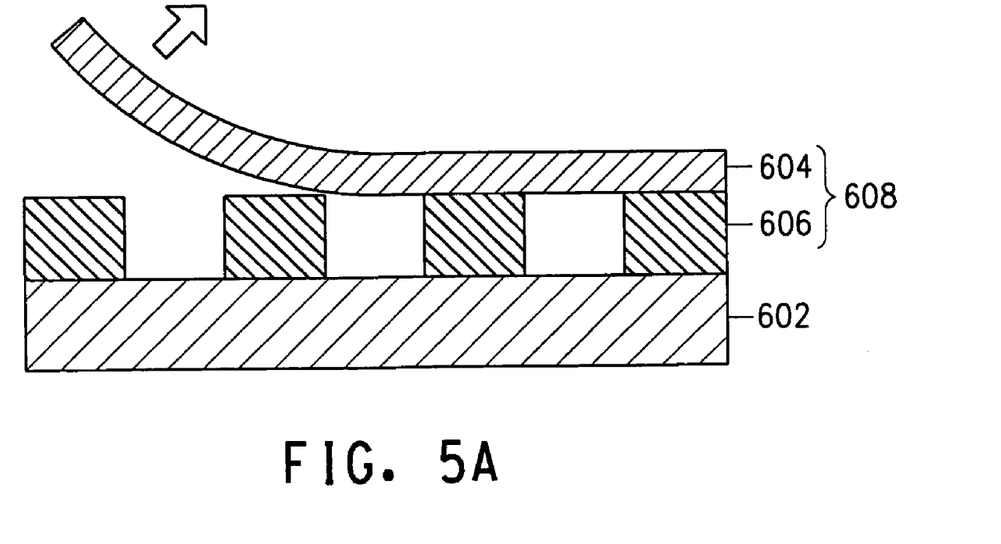
FIGS. 5A and 5B are lateral cross-sectional views of a step in which a film base material is separated from a transfer pattern material.
Figure 5B:
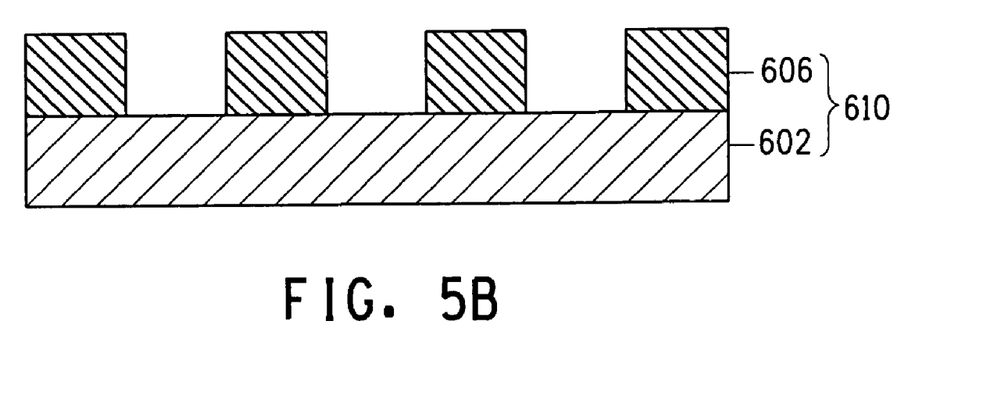

FIG. 5 is a detailed lateral cross-sectional view of the third step S206 in FIG. 2. In this step, only a film base material 604 is separated from a transfer film 608, comprised of a film base material 604 and a transfer pattern material 606, stuck to a substrate 602 (FIG. 5A). Separation can be carried out easily by using, for example, a dicing tape separation apparatus used in semiconductor production. This type of procedure allows the obtaining of a laminate 610 in which transfer pattern material 606 is formed on substrate 602 (FIG. 5B).

In this step, the adhesive strength between film base material 604 and transfer pattern material 606 is required to be less than the adhesive strength between transfer pattern material 606 and substrate 602. In the case the adhesive strength between film base material 604 and transfer pattern material 606 is weak, film base material 604 separates from transfer pattern material 606.

Adhesive strength can be controlled according to the selection of the materials used and the adhesive. For example, the adhesive strength between film base material 604 and transfer pattern material 606 can be made to be extremely weak by using a fluorine film such as a TEFLON® PFA film (commercially available from E.I. du Pont de Nemours and Company) for film base material 604. In addition, peel strength may also be controlled by adhering transfer pattern material 606 and substrate 602 with a powerful adhesive. Examples of adhesives useful in the present invention include thermo elastic adhesive such as silicone, rubber, elastomer and acrylic type adhesives.

(Fourth and Fifth Steps)

FIG. 6 is a detailed lateral cross-sectional view of the fourth step S208 and the fifth step S210 in FIG. 2. First, in the fourth step, a paste 706 is filled into a transfer pattern depression stuck to substrate 702 (FIG. 6A). After filling the paste, any residual paste remaining on transfer pattern material 704 (not shown) is either wiped off with a solvent or the substrate surface is cleaned with a blasting apparatus or polisher. Residual paste can cause the formation of undissolved portions during removal of transfer pattern material 704 by dissolving to be described later. In the case of removing using a peel-off method to be described later, there is the risk of the paste being peeled off or the substrate being contaminated. Paste may be removed each time in the case of repeatedly filling and drying the paste.

Figure 6A:
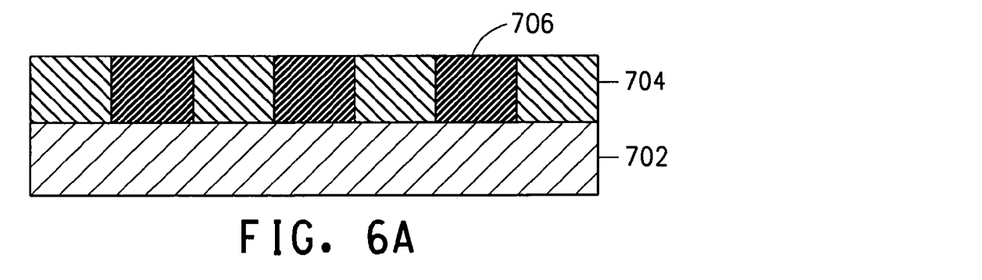
FIGS. 6A-6D are lateral cross-sectional views of steps in which a paste is applied into a transfer pattern depression, and a step in which a paste is solidified.

The type of paste filled may be suitably selected corresponding to the purpose of the formed pattern. For example, in the case of forming an electrically conductive pattern, a paste containing an electrically conductive powder may be filled. Examples of electrically conductive powders which can be used include, but are not limited to, gold, silver, copper, palladium, platinum, nickel, tin and carbon powder and mixtures thereof. A mixed type combining two or more types of materials may also be used. Examples of mixed types include types in which the surface of an electrically conductive powder is coated with a different metal (e.g., silver-coated copper), alloy types in which two or more types of electrically conductive powders are alloyed in combination (e.g., silver-copper, silver-palladium and silver-tin powder), and compound types (e.g., zinc oxide, tin oxide, ruthenium oxide and lanthanum hexaboride).

Figure 6B:
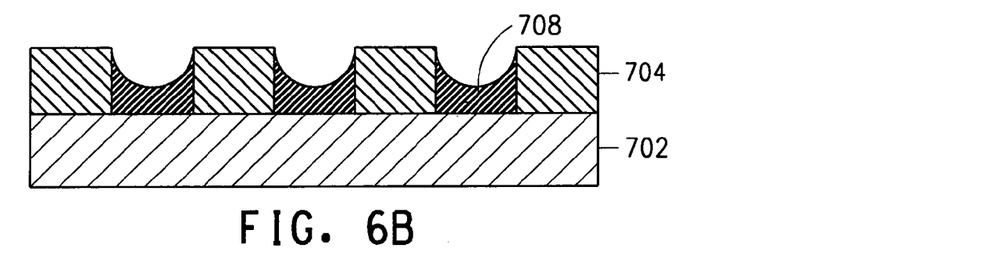

Next, in the fifth step, dry paste pattern 708 (FIG. 6B) is obtained by solidifying the paste. Methods used to solidify the paste depend on the type of paste. For example, solidification by drying, hardening by heat or hardening by light may be used. It is preferable to determine the suitable solidification method based on the paste properties.

Figure 6C:
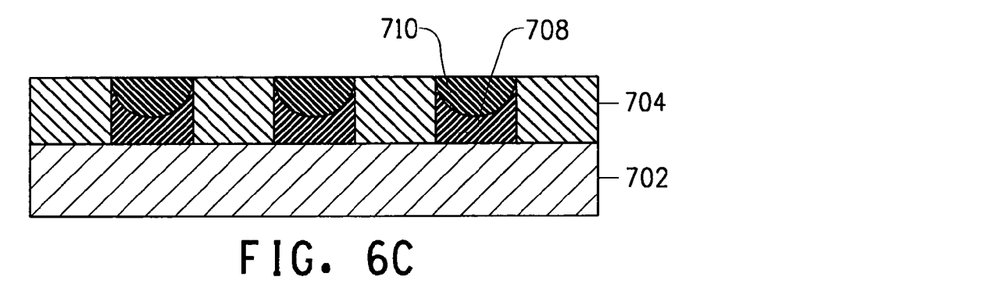
Figure 6D:
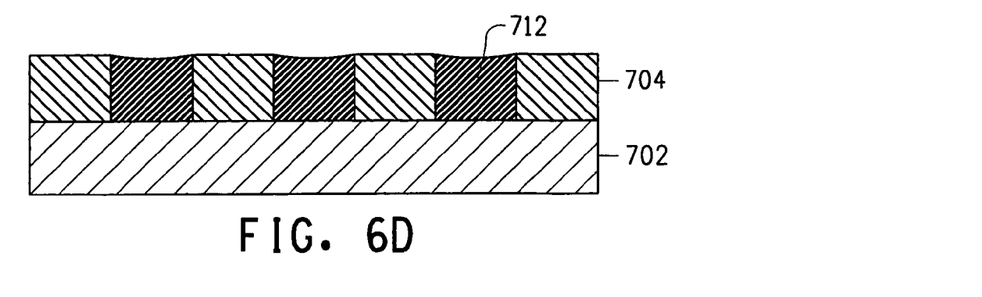

However, in some embodiments, there are cases in which a dry paste pattern of a desired height (and therefore, aspect ratio) is unable to be obtained by evaporation of solvent components in the paste with a single round of paste filling and drying. In such cases, a dry paste pattern 712 of a desired height is obtained by filling additional paste 710 onto dry paste pattern 708 (fourth step) and then drying this additional paste (fifth step) (FIGS. 6C and 6D).

Although paste filling and drying are carried two times each in the above-mentioned explanation, there are no limitations on the number of times these can be carried out, and may be carried out as many times as is necessary to obtain a dry paste of the desired height. Therefore, in some embodiments, multiple paste application and drying steps are carried out.

In order to produce a paste pattern having a desired aspect ratio in a single filling, transfer pattern material 704 may be laminated several times in advance so as to be formed sufficiently higher than a desired paste pattern height, and then paste 706 may be filled while anticipating the evaporated amount of the solvent component during drying thereof.

(Sixth Step)

Figures 7A, 7C, 7D, 7E:
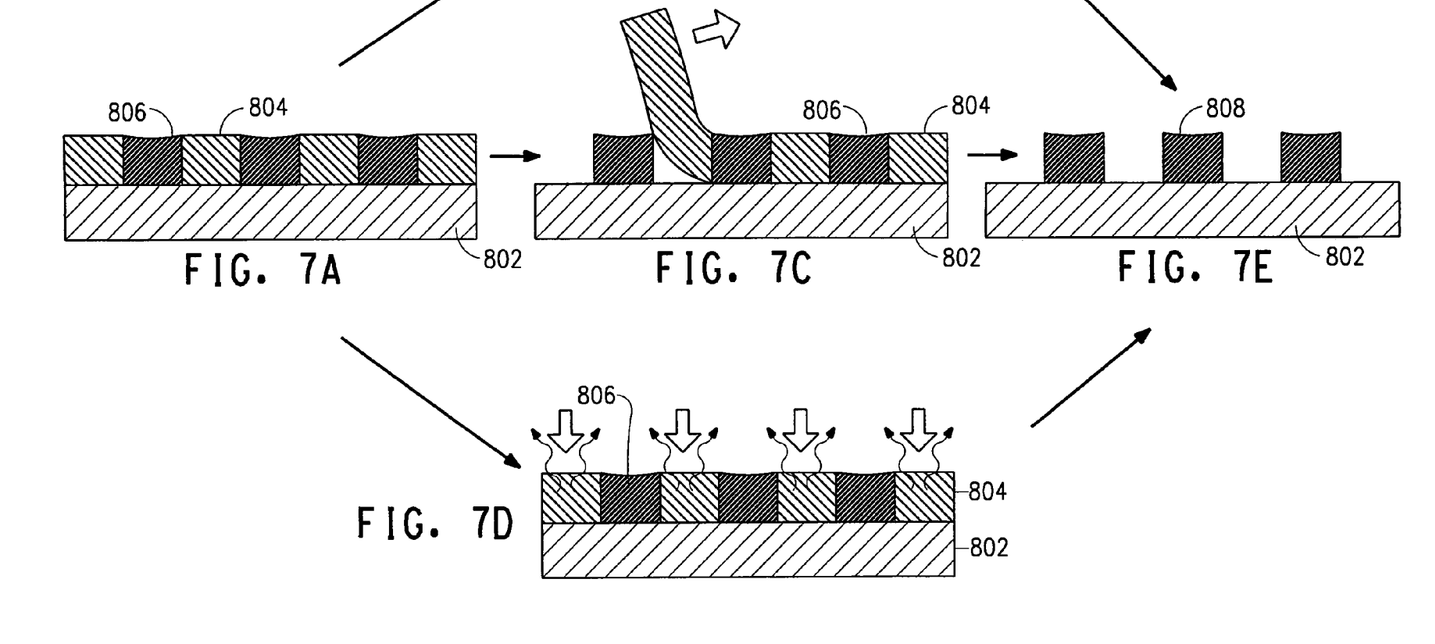
FIGS. 7A-7E is a lateral cross-sectional view of a step in which a transfer pattern material is removed.
Figure 7B:
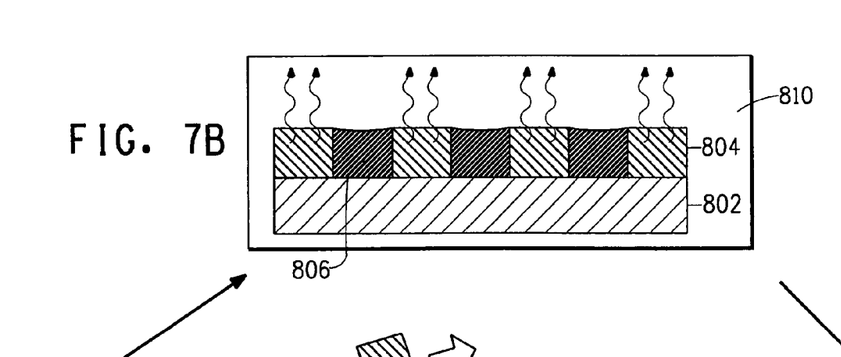

FIG. 7 is a detailed lateral cross-sectional view of a sixth step S212 in FIG. 2. In this step, the transfer pattern material 804 is removed (FIGS. 7B to 7D) from the substrate 802 and dry paste pattern 806 applied and dried in transfer pattern depression (FIG. 7A) to obtain a desired paste pattern 808 (FIG. 7E). Examples of removal methods which can be used include, but are not limited to, a method in which removal is carried out by dissolving (FIG. 7B), a method in which removal is carried out by separation (peel-off) (FIG. 7C), and a method in which removal is carried out by baking (FIG. 7D).

In the case of employing a dissolving method, transfer pattern material 804 is removed by utilizing the difference in the solubility of substrate 802 and dry paste pattern 806 and the solubility of transfer pattern material 804 (FIG. 7B). A solvent which dissolves the transfer pattern material 804 without also dissolving substrate 802 and dry paste pattern 806 is suitable selected for use as solvent 810. Dissolving can be carried out by utilizing various materials including water, an alkaline aqueous solution or an organic solvent.

In the case of dissolving with water, transfer pattern material 804 is preferably formed from, for example, a water-soluble resin such as polyvinyl alcohol PVA, while paste 806 is preferably formed from a non-water-soluble substance. Dissolving with water is the most preferable from the viewpoint of safety and environmental destruction caused by waste liquid.

In the case of employing a method of dissolving with an alkaline aqueous solution, transfer pattern material 804 is preferably formed with a resin that can be dissolved in an alkaline aqueous solution, while paste 806 is preferably formed with a resin which is insoluble in an alkaline aqueous solution. In the case of employing a method of dissolving with an organic solvent, transfer pattern material 804 is preferably formed from a material which is soluble in the organic solvent used, while paste 806 is preferably formed from a resin which is insoluble in the organic solvent used.

In the case of employing a method using separation (peel-off method), removal is carried out by, for example, using a dicing tape separation apparatus used in semiconductor production (FIG. 7C). A method which uses separation enables production costs to be further reduced as compared with the above case of dissolving with water since special equipment is not required.

In the case of employing a method using baking, transfer pattern material 804 is removed by utilizing the difference in the content of impurities (or organic matter) in substrate 802 and dry paste pattern 806 and the content of impurities (or organic matter) of transfer pattern material 804 (FIG. 7D). Namely, since organic matter volatilizes while inorganic matter remains as a result of baking, by preliminarily making nearly all of substrate 802 and dry paste pattern 806 to be composed of inorganic matter, and while making nearly all of transfer pattern material 804 to be composed of organic matter, the transfer pattern material 804 is eliminated by baking, for example, in a convection oven. Baking conditions may be suitably selected corresponding to the material used to form the transfer pattern material. It is necessary to raise the baking temperature in the case of using a resin resistant to thermal decomposition. On the other hand, the transfer pattern material can be removed at a comparatively low baking temperature in the case of using a resin susceptible to thermal decomposition. Furthermore, the desired paste pattern 808 in FIG. 7E may also be obtained without using a baking oven by, for example, bringing a burner in close proximity from the direction indicated with the thick arrows shown in FIG. 7D and baking off transfer pattern material 804.

Although the above explanation has described a dissolving method, peel-off method and baking method as examples of methods for removing the transfer pattern material from a substrate, these methods can be suitably selected according to various purposes.

Although the peel-off method requires several peeling operations equal to the number of each portion of the transfer pattern material if a plurality of transfer pattern material transferred to the substrate are present separately, the dissolving method realizes removal of the transfer pattern material by only immersing in solution once regardless of the shape of the transfer pattern material In other words, when it is desirable to remove the transfer pattern material in a single operation (or step), the dissolving method is advantageous. In addition, since there is no generation of debris and so forth during separation of the depression as when using the peel-off method, the dissolving method allows the obtaining of a highly accurate paste pattern shape.

In addition, although the dissolving method requires an apparatus and solution for immersing in solution, the peel-off method does not require any such apparatuses and so on to be provided, and simply requires that the transfer pattern material be able to be peeled off mechanically, thereby making this method advantageous. Moreover, in the peel-off method, the pattern paste material is only required to be provided adhesiveness with the substrate and non-adhesiveness with the transfer pattern material, and since it is not required to be provided with solvent resistance as in the case of pattern paste materials used in the dissolving method, a wide range of materials can be selected.

Moreover, since the baking method requires a high temperature for baking, it has the disadvantage of only being able to be used with heat-resistant, organic substrates as compared with the dissolving method and peel-off method. However, since this method does not require that considerations be given to differences in solubility or tackiness with the substrate with respect to the characteristics of the transfer pattern material, there are more choices available for the transfer pattern material, thereby offering the advantage of facilitating removal thereof.

As has been explained above, the paste pattern formation method of the present invention, which comprises the above-mentioned first to sixth steps, offers the advantages of reduced production costs, easy production and the formation of patterns having a high aspect ratio without less desirable paste pattern properties. In addition, paste patterns obtained by this type of formation method are suitable for use as the electrode patterns of solar cells, the wiring patterns of wiring boards, or the barrier ribs of plasma display panels.

EXAMPLES

Example 1

Production of Black Paste for Transfer Film 35 parts of polyvinyl alcohol resin PVA #500 (Kanto Chemical) were added to 65 parts of ion exchange water heated to 90° C. in a stainless steel container, and then dissolved by stirring for 2 hours. Next, after cooling the solution to room temperature, 15 parts of glycerin (Kanto Chemical) were added and stirred for 5 minutes. Next, 20 parts of a commercially available Indian ink (Kuretake, BA7-18) were added followed by stirring for 5 minutes to obtain a black paste-like PVA solution. Finally, this PVA solution was transferred to a plastic container and allowed to stand overnight to obtain a black paste for a transfer film.

(Production of Transfer Film)

Using a TEFLON (registered trademark) 500 PFA film (available from E.I. du Pont de Nemours and Co.) for the film base material (film thickness: 125 µm), the black paste was coated thereon using a doctor blade method. Next, the coated paste was dried for 10 minutes in an oven at 85° C. Moreover, the PFA film coated with the black paste was removed from the oven and allowed to stand to cool to room temperature to obtain a glossy black film. Subsequently, when the thickness of the black film was measured with a micrometer, the film thickness was found to be 70 µm. This black film was then patterned to the shape of a pattern produced by CAD using a YAG laser marker (COMMAX, YAG-5W, wavelength: 1064 nm). The shape of the pattern of the resulting transfer pattern depression was 70 µm wide and 70 µm deep.

(Transfer of Transform Film Having Transfer Pattern Formed Thereon to a Substrate)

A glass substrate was preheated for 1 minute on a hot plate at 100° C. Next, a transfer film on which a transfer pattern was formed was arranged on the preheated glass substrate so that the transfer pattern side contacted the glass substrate, and after allowing to stand for 10 seconds, the transfer film was pressed onto the glass substrate. Moreover, the glass substrate with transfer film was removed from the hot plate and allowed to stand until it returned to room temperature. When the film base material in the form of PFA film was slowly peeled from the glass substrate with transfer film stuck in this manner, the transfer pattern material was stuck on the glass substrate. The shape of the resulting transfer pattern depression was 70 µm wide and 70 µm deep.

(Filling of Paste)

A silver paste (available from du Pont de Nemours and Co. as Product No. CB700) was applied to the transfer pattern depression by squeegee. Next, the glass substrate having the transfer pattern depression filled with silver paste was placed on a hot plate at 80° C. for 5 minutes to pre-dry the coated silver paste. The glass substrate was removed from the hot plate and allowed to stand until it returned to room temperature. After drying, since a slight indentation was observed where the silver paste was embedded in the transfer pattern depression, silver paste was applied again by squeegeeing to fill in the indentation. Subsequently, the glass substrate in which the transfer pattern depression had been re-filled with silver paste was placed on a hot plate at 80° C. for 10 minutes to pre-dry the coated silver paste. The substrate was removed from the hot plate and allowed to stand until it returned to room temperature. There was minimal indentation observed where the silver paste was embedded in the depression after drying. Finally, paste remaining on the transfer pattern material was wiped off using a solvent (available from du Pont de Nemours and Co., Axerel® 2000).

(Separation of Transfer Film: Peel-Off Method)

After drying the substrate having a transfer pattern depression filled with paste by heating for 15 minutes on a hot plate at 130° C., the substrate was allowed to stand until it returned to room temperature. Next, the transfer pattern material was slowly peeled off by hand. As a result, only the paste pattern of the embedded silver paste remained on the substrate. The shape of the resulting paste pattern was 70 μm wide and 60 μm deep.

As described above, a paste pattern having a high aspect ratio (6/7) was able to be formed easily using the peel-off method.

Example 2

Separation of Transfer Film: Hot Water Dissolving Method

A substrate having a transfer pattern depression filled with paste produced using the same method as Example 1 was heated for 10 minutes on a hot plate at 130° C. followed by removing from the hot plate and allowing to stand until it returned to room temperature. Next, the substrate with transfer pattern material was immersed for 10 minutes in hot water at 80° C. followed by ultrasonic treatment for 30 seconds using an ultrasonic cleaner. Subsequently, the substrate was removed from the hot water and washed with running water at 40° C. As a result, only the paste pattern of the embedded silver paste remained on the substrate. The shape of the resulting paste pattern was 70 μm wide and 60 μm deep. As noted previously, the aspect ratio has no upper limit, however in this example the aspect ratio was 6/7.

As has been described above, a paste pattern having a high aspect ratio (6/7) was also able to be formed easily using a hot water dissolving method.

What is claimed is:

1. A paste pattern formation method comprising the steps of:
    applying a transfer pattern on a film base material, wherein said transfer pattern comprises a transfer pattern material and transfer pattern depressions, thus forming a transfer film;
    transferring the transfer film, onto a substrate so that the transfer pattern material contacts the substrate and so that the film base material is on the back of the transfer pattern material;
    separating the film base material from the transfer pattern material;
    applying a paste into the transfer pattern depressions, resulting in a paste pattern adhering to the substrate;
    solidifying the paste; and then
    removing the transfer pattern material, that is located around the solidified paste on the substrate, leaving only the solidified paste on the substrate.

2. A paste pattern formation method comprising the steps of:
    applying a transfer pattern material on a film base material;
    forming transfer pattern depression(s) in the transfer pattern material, thus forming a transfer film;
    transferring the transfer film onto a substrate so that the transfer pattern material contacts the substrate and the film base material is on the back of the transfer pattern material;
    separating the film base material from the transfer pattern material;
    applying a paste into the transfer pattern depression(s), resulting in a paste pattern adhering on the substrate;
    solidifying the paste; and then
    removing the transfer pattern material, that is located around the solidified paste on the substrate, leaving the solidified paste on the substrate.

3. The paste pattern formation method according to claim 2, wherein the transfer pattern depression(s) are patterned with a laser.

4. The paste pattern formation method according to claim 2, wherein the transfer pattern depression(s) are patterned by photoetching.

5. The paste pattern formation method according to claim 2, wherein the transfer pattern depression(s) are patterned by press stamping.

6. The paste pattern formation method according to claim 1 or 2, wherein the transfer film is adhered by pressure onto the substrate onto which the paste pattern is formed.

7. The paste pattern formation method according to claim 1 or 2, wherein the transfer film is adhered with an adhesive onto the substrate onto which a paste pattern is formed.

8. The paste pattern formation method according to claim 1 or 2, further comprising a step of, after applying the paste into the transfer pattern depression(s), removing the paste remaining on the transfer pattern material.

9. The paste pattern formation method according to claim 1 or 2, wherein the step of applying the paste into the transfer pattern depression(s) and the step of solidifying the paste are repeated two times or more until a predetermined paste pattern height is obtained.

10. The paste pattern formation method according to claim 1 or 2, wherein the transfer pattern material is removed by dissolving with water.

11. The paste pattern formation method according to claim 10, wherein the transfer pattern material comprises a water-soluble resin.

12. The paste pattern formation method according to claim 1 or 2, wherein the transfer pattern material is removed by dissolving with an organic solvent.

13. The paste pattern formation method according to claim 1 or 2, wherein the transfer pattern material is removed by baking.

14. The paste pattern formation method according to claim 1 or 2, wherein the paste pattern is an electrode pattern of a solar cell.

15. The paste pattern formation method according to claim 1 or 2, wherein the paste pattern is a wiring pattern of a wiring board.

16. The paste pattern formation method according to claim 1 or 2, wherein the paste pattern is a barrier rib of a plasma display panel.

17. The paste formation method according to claim 11, wherein the water-soluble resin is selected from the group consisting of: polyvinyl alcohol, polyvinyl pyrrolidone and carboxymethyl cellulose.

* * * * *